United States Patent [19]
Lin

[11] Patent Number: 6,133,151
[45] Date of Patent: Oct. 17, 2000

[54] HDP-CVD METHOD FOR SPACER FORMATION

[75] Inventor: Ching-Fu Lin, Taipei, Taiwan

[73] Assignee: Worldwide Semiconductor Manufacturing Corp., Hsinchu, Taiwan

[21] Appl. No.: 09/307,760

[22] Filed: May 10, 1999

[51] Int. Cl.[7] .................................................. H01L 21/311
[52] U.S. Cl. ........................................... 438/694; 438/706
[58] Field of Search ..................................... 438/303, 585, 438/595, 694, 706, 707, 710, 717, 720, 723

[56] References Cited

U.S. PATENT DOCUMENTS

| | | | |
|---|---|---|---|
| 5,686,356 | 11/1997 | Jain et al. | 437/195 |
| 5,851,900 | 12/1998 | Chu et al. | 438/434 |
| 6,033,981 | 3/2000 | Lee et al. | 438/624 |
| 6,040,223 | 3/2000 | Liu et al. | 438/303 |

*Primary Examiner*—Felisa Hiteshew
*Assistant Examiner*—Kin-Chan Chen

[57] ABSTRACT

A method for forming a self-aligned contact structure is disclosed based on an HDP-CVD (High-Density Plasma-Chemical Vapor Deposition) process. Initially, after a polysilicon layer and a metal layer are deposited and patterned on a wafer to fabricate a gate stack, an HDP-CVD process is employed to form a deposition layer to cover the patterned layers and wafer. A building of sharp ridges occurs over the gate stack. Next, a spacer deposition layer is then conformally deposited to cover the HDP-CVD deposition layer. An anisotropically etch process is then performed to etch the spacer deposition layer, wherein at least portions of the spacer deposition layer still covers top of the gate stack. Another anisotropically etch process is then performed to form the required contacts on the wafer. Because the HDP-CVD deposition layer on the gate structure is thick enough to protect the gate stack from etching, it is unnecessary to form the cap layer as conventionally.

20 Claims, 4 Drawing Sheets

HDP-CVD METHOD FOR SPACER FORMATION

BACKGROUND OF THE INVENTION

1. Field of the Invention

The invention relates to a method for forming spacers of a semiconductor device, and particularly to a method for forming narrower spacers by using an HDP-CVD scheme accompanied with fewer processes and masks than conventional approaches.

2. Description of the Prior Art

In the currently VLSI (Very-Large-Scale Integration) circuit processes, methods for forming sidewall spacers are important and broadly used technologies because several advantages are offered from applying sidewall spacers. Firstly, sidewall spacers can be employed as masks when implementing lightly doped drain (LDD) layers. Additionally, the sidewall spacers can isolate the conductive layer that the sidewall spacers abut against from conducting current through the spacers to a gate stack which is protect by the spacers. On the other hand, because overetching is one critical disadvantage that usually placing two structures closer together than intended, self-alignment structure is thus required in the modem semiconductor processes for overcoming the overetching problem. Also, the spacers can be used for accommodating misalignment such as the self-aligned contact (SAC) manufacturing. However, there are complicated processes and many masks required for forming a SAC structure in a semiconductor device.

Please refer to FIG. 1, which shows a cross-section representative of a basic structure of SAC. Three isolated gate stacks 102 are formed on a wafer 100, wherein each the gate stack 102 is basically composed of a gate oxide layer (not shown) a polysilicon layer 104, a gate metal layer 106, a cap layer 108, spacers 110, and a cap dielectric layer 112. Tungsten silicide ($WSi_x$) is a broadly employed material to form the gate metal layer 106 conventionally. The silicide film formed on the polysilicon layer 104, known as a policide structure, have been fabricated to lower the sheet resistance of the polysilicon gates.

Typically, the formation of the above layers, such as the polysilicon layer 104, metal layer 106 and cap layer 108, are sequentially deposited and patterned on the wafer 100. Next, conventionally, the spacer 110 is formed from depositing a silicon dioxide or silicon nitride layer then followed by an anisotropically etch process. Finally, a cap silicon nitride layer can be deposited followed by an anisotropically etch process to fabricate the cap dielectric layer 112. After an internal dielectric layer 114 is deposited and patterned on the wafer 100, a contact 116 is then formed on the wafer 100 through anisotropically etching the internal dielectric layer 114. As noted, the detail structures in the wafer are not shown for simplifying descriptions, and the above two contacts 116 and the internal dielectric layer 114 are used for conducting and protecting purpose, respectively. As known by the skilled persons, the cap dielectric layer 112 is used for self-aligned purpose so as to terminate the formation of the contact 116, which indicates that the compositions of the cap dielectric layer 112 and the internal dielectric layer 114 must have high selectivity. Conventionally, the cap dielectric layer 112 is composed by silicon nitride and the internal dielectric layer 114 is composed by dioxide.

On the other hand, vertical sidewall spacers are typically formed in conventional approaches for achieving spacer length criteria; however, the anisotropically etch process for forming the contact 116 will simultaneously etch portions of the spacers 110, which will decrease the spacer size and thus destroy the gate stack 102. Accordingly, the application of employing the cap dielectric layer 112 can protect the spacers 110 from being overetched, which also implies that the conduction between the metal layer 106 and the contact 116 and be avoided.

Unfortunately, some disadvantages are still offered by the conventional SAC structure. Firstly, the spacers 110 and cap dielectric layer 112 usually occupy large available spaces between two gate stacks 102, which will in turn increase the aspect ratio for following gap filling processes. Some further drawbacks, such as voids, may be arisen in the consecutive gap filling processes due to poor step coverage, for example when depositing the internal dielectric layer 114. Secondly, the required cap layer 108 for protecting the gate stacks 102 will make the whole integration complicated, hard to control, and costly. For example, the composition of the cap layer 108 is usually not the same as those deposition layers under it. Therefore, different processes are required to respectively etch the cap layer 108, metal layer 106 and polysilicon layer 104 accompanied with etchant having high selectivity for avoiding undesired etch results. A need has arisen to disclose a method for forming a spacer with narrower width than conventional approaches, in which the cap dielectric layer used conventionally, can be eliminated for cost-down purpose simultaneously.

SUMMARY OF THE INVENTION

It is an object of the invention to disclose a method for forming a spacer with narrow width than ever.

The other object of the invention is to disclose a method for forming a spacer without necessary to form a cap dielectric layer.

The further object of the invention is to disclose a method for forming a self-aligned contact structure with fewer processes and lower cost than the conventional.

According to the above objects, the disclosed method utilizes an HDP-CVD (High-Density Plasma-Chemical Vapor Deposition) process for achieving the aforementioned purposes. Initially, after a polysilicon layer and a metal layer are deposited and patterned on a wafer to fabricate a gate stack, an HDP-CVD process is then employed to form a deposition layer to cover the patterned layers and wafer. A building of sharp ridges occurs over the gate stack. Next, a spacer deposition layer is then conformally deposited to cover the HDP-CVD deposition layer. An anisotropically etch process is then performed to etch the spacer deposition layer, wherein at least portions of the spacer deposition layer still covers top of the gate stack. The HDP-CVD deposition layer and spacer deposition layer is composed of silicon dioxide and silicon nitride in the invention, respectively. Then, an internal dielectric layer is deposited and patterned on the wafer to define the required contacts. Another anisotropically etch process is then performed to fabricate the contacts. Because the HDP-CVD deposition layer on the gate structure is thick enough to protect the gate stack from etching, it is unnecessary to form the cap layer as conventionally. Furthermore, the dielectric gap filling will be easier to implement due to the size degradations by removing materials from both the cap dielectric layer and spacers.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DESCRIPTION OF THE PREFERRED EMBODIMENT

Figure 1:
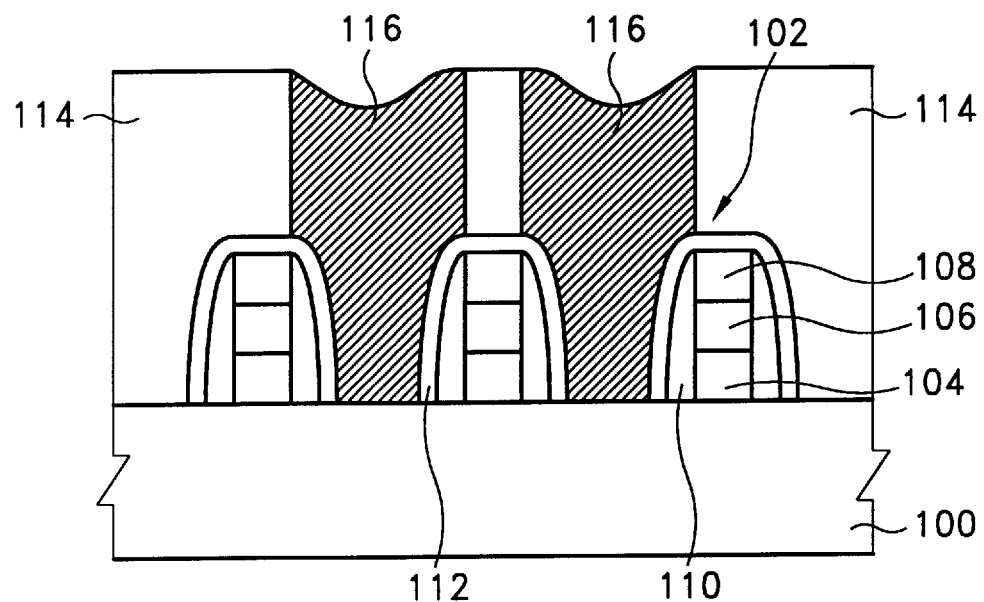
FIG. 1 is a cross-section representative of a conventional SAC structure.
Figure 2:
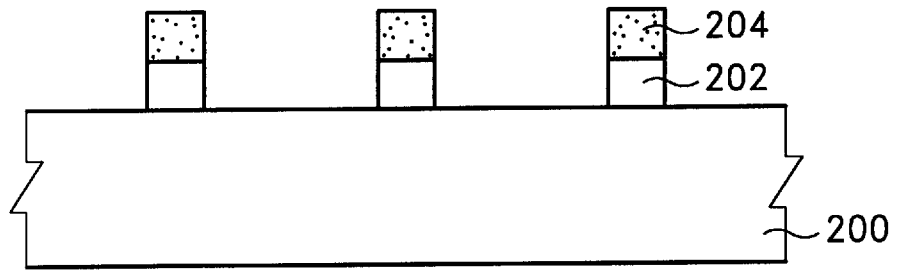
FIG. 2 depicts a cross-section representative of a polysilicon layer and a metal layer are sequentially deposited and patterned on a wafer for fabricating a gate stack.

Please refer to FIG. 2, wherein a cross sectional view is shown for describing when a polysilicon layer 202 and a metal layer 204 are sequentially deposited and patterned on a wafer 202 for forming a gate stack. Conventional processes for forming the policide structure, such as depositing and patterning for both a tungsten silicide ($WSi_x$) layer and the polysilicon layer 202, can be applied in the invention. Then, an HDP-CVP deposition layer 206 is deposited to cover to the wafer 200, such as the cross section in FIG. 3. Please note that sharp ridges are formed over the gate stack because the sputter rate near corners is higher than elsewhere in the HDP-CVD process (explained later). In the preferred embodiment, the HDP-CVD deposition layer 206 is grown under the circumstance with a temperature from −10 to 100° C., an $O_2$ gas flow into the chamber from 3 to 300 sccm, a $SiH_4$ gas flow into the chamber from 3 to 300 sccm, and the pressure in the chamber from 10 to 100 milliTorr for depositing about 0.1 to 3 minutes. Therefore, a silicon dioxide layer is formed as the HDP-CVD deposition layer 206 in the invention.

HDP-CVD is a brand new gap filling technology that is performed based on high-density plasma accompanied with chemical vapor deposition for sputtering etching of silicon dioxide. One important advantage is that the sputter rate of silicon dioxide reaches a maximum when the bombarding ions reach the surface at a 50° angle with the normal of that surface. Voids free filling of narrow spaces with high aspect ratios can be achieved. In the preferred embodiment, the characteristics of HDP-CVD process such as having a maximum sputter rate at about 50° angle is trickily employed to deposit the spacer deposition layer 208 in stead of gap filling. Due to a building of sharp ridges is formed on top of the gate stacks, it is unnecessary to perform additional process to fabricate the conventional cap dielectric layer in the invention.

Figure 3:
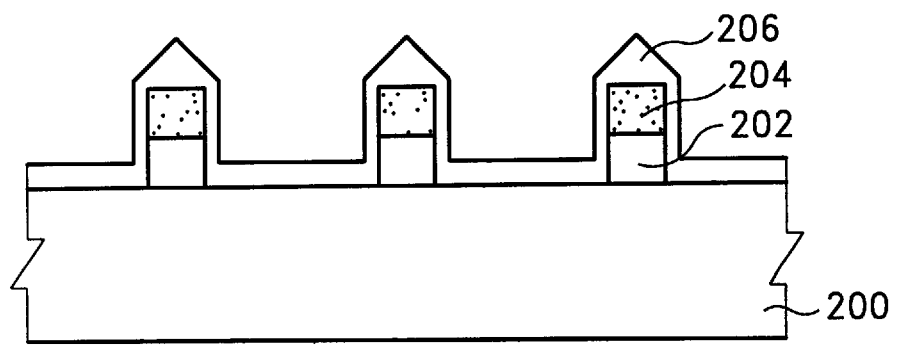
FIG. 3 depicts a cross-section representative of when an HDP-CVD deposition layer is deposited on the wafer of FIG. 2.
Figure 4:
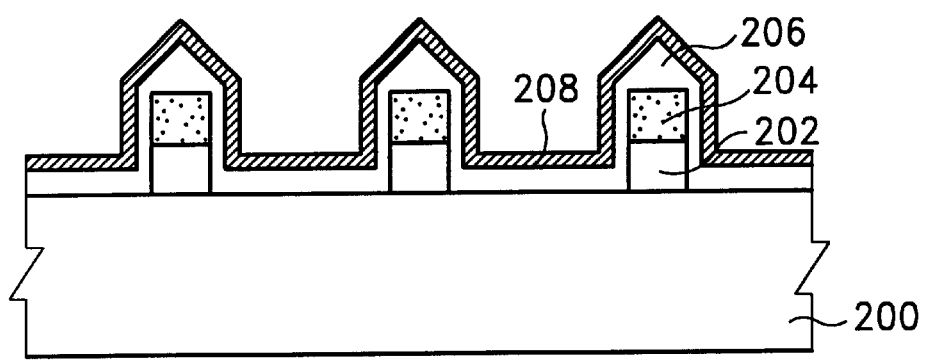
FIG. 4 depicts a cross-section representative of when a spacer deposition layer is conformally deposited on the wafer of FIG. 3.

Based on the structure of FIG. 3, a spacer deposition layer 208 is deposited on the wafer 200, wherein the silicon nitride layer 208 conformally covers the wafer 200 along the topography as the cross section of FIG. 4. In the preferred embodiment, the spacer deposition layer 208 is composed of silicon nitride deposited by using conventional methods such as reaction of ammonia ($NH_3$) with either silane ($SiH_4$) in APCVD, (Atmospheric pressure chemical vapor deposition) or LPCVD (Low-pressure chemical vapor deposition). Therefore, the HDP-CVD deposition layer 206 and spacer deposition layer 208 are high selectivity due to different compositions.

Figure 5:
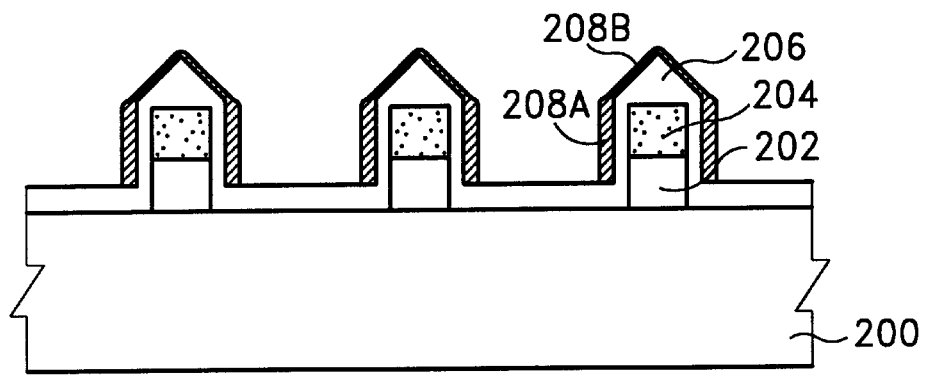
FIG. 5 depicts a cross-section representative of when an anisotropically etch process is performed to the wafer of FIG. 4 for etching the spacer deposition layer.
Figure 9:
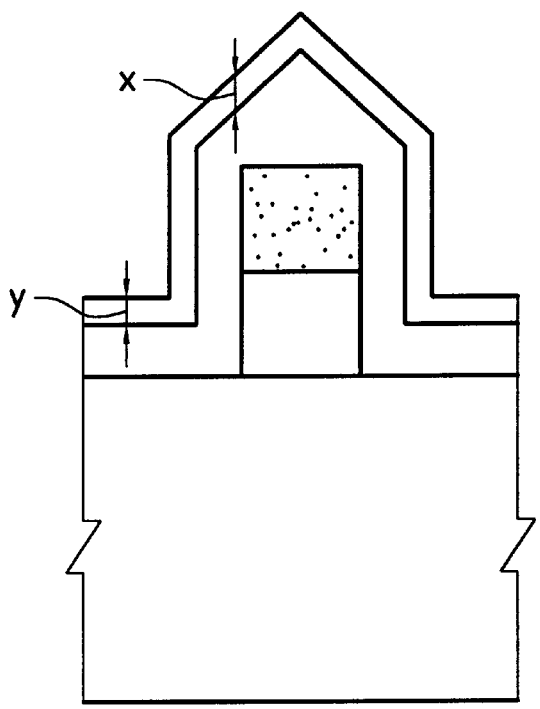
FIG. 9 depicts a cross-section representative of the etched depth of the spacer deposition layer when performing the anisotropically etch process to the wafer of FIG. 5.

Next, an anisotropically etch process is performed to etch the spacer deposition layer 208. Conventional approaches for etching the silicon nitride layer, such as etched at room temperature in concentrated HF or buffered HF and in H3PO4 at 150 to 200° C., can be used in the invention for removing the silicon nitride. Please note that portions of the spacer deposition layer 208A and 208B respectively remain on sidewall and top of the gate stack. Please refer to FIG. 9, wherein a profile is shown for describing the experience of the spacer deposition layer 208B. It is obvious from the FIG. 9 that the vertical depth x of the spacer deposition layer 208 over the gate stack is thicker than the vertical depth y of the spacer deposition layer 208 that placed between two gate stacks. Accordingly, the spacer deposition layer 208B will be remained while whole the spacer deposition layer 208 that placed between two gate stacks is completely removed. A cross sectional view in FIG. 5 shows the structure when the anisotropically process terminates. The remained spacer deposition layer 208A and 208B are respectively used as a cap layer and spacers that do not need further processes to form thereon.

Figure 6:
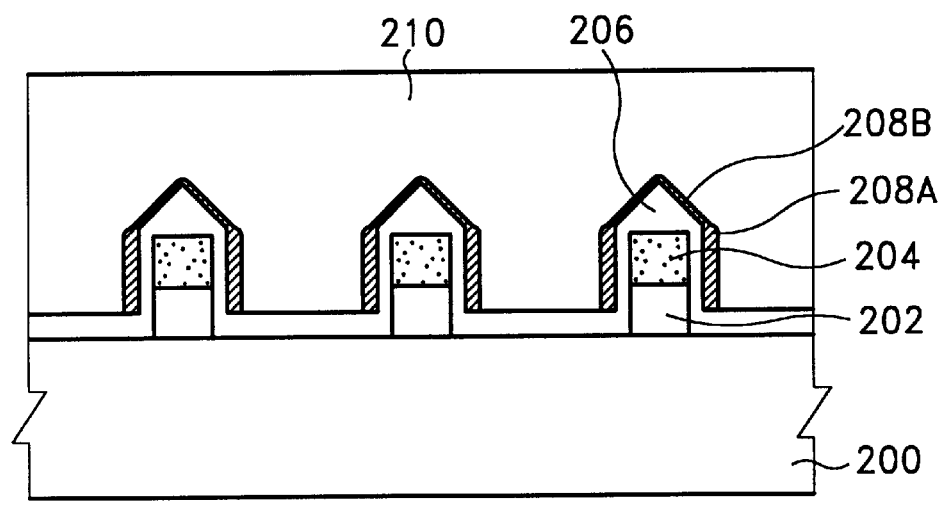
FIG. 6 depicts a cross-section representative of when an internal dielectric layer is deposited on the wafer of FIG. 5.
Figure 7:
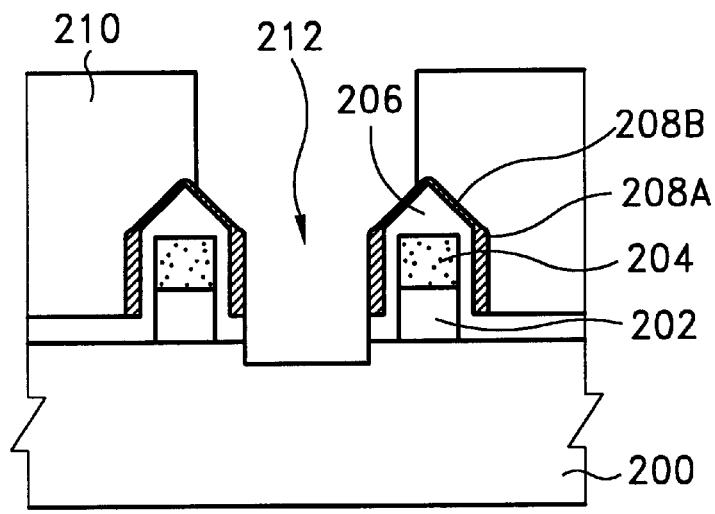
FIG. 7 depicts a cross-section representative of when another anisotropically etch process is performed to etch the internal dielectric layer to fabricate a contact on the wafer of FIG. 6.

As shown in FIG. 6, an internal dielectric layer 210 can then be deposited on the structure of FIG. 5 to isolate the gate stacks. A contact 212 is then formed through another anisotropically etch process as shown in FIG. 7. In the preferred embodiment, the internal dielectric layer 210 can be formed by silicon dioxide deposition based on conventional APCVD or LPCVD process. Please note that the spacer deposition layer 208 and internal dielectric layer 210 must have high selectivity such that the remained spacer deposition layer 208A and 208B will not be etched when forming the contact 212. Furthermore, portions of the HDP-CVD deposition layer 206 that placed between two of the gate stacks and non-covered by the remained pacer deposition layer 208A and 208B will be removed simultaneously. Therefore, consecutive processes, such as metal layer deposition for filling the contact 212 can then be performed based on the structure in FIG. 7 (Not shown).

Figure 8A:
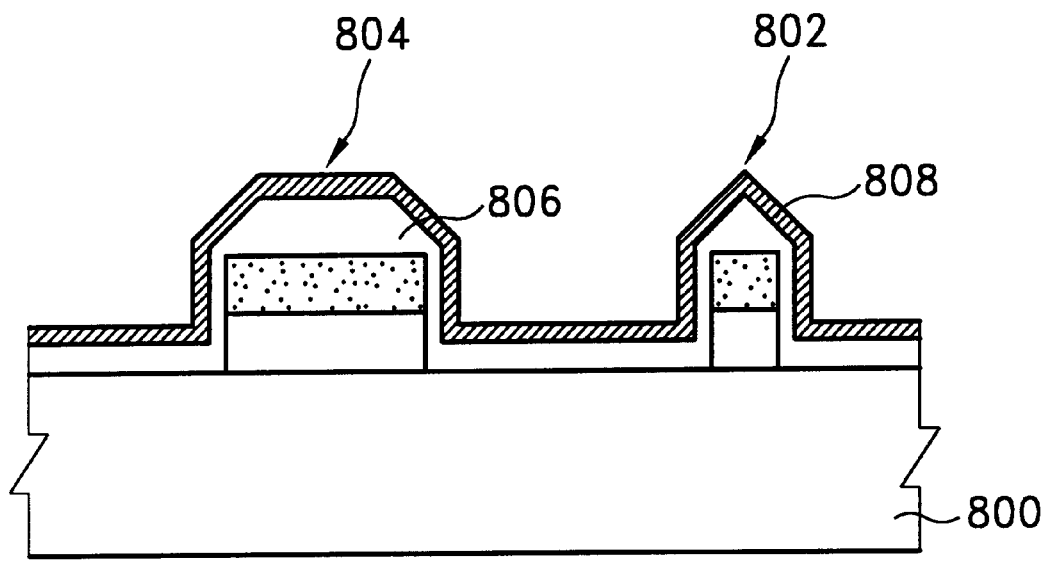
FIG. 8A depicts a cross-section representative of when the disclosed method being employed in gate stacks having larger sizes.
Figure 8B:
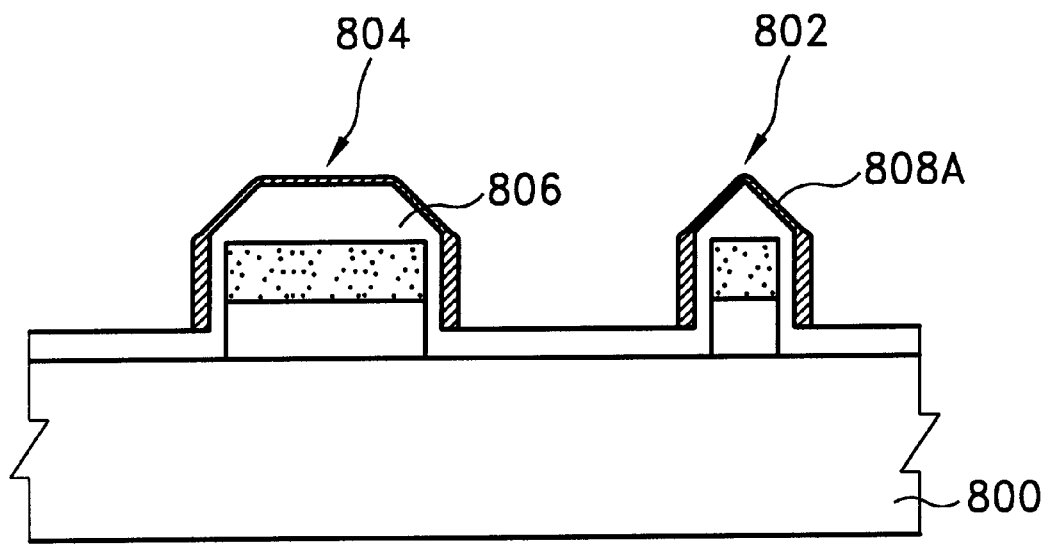
FIG. 8B depicts a cross-section representative of when the spacer deposition layer of FIG. 8A being etched to form spacers against the gate stacks.

The method disclosed in the invention still works even the gate stack having a larger size than normal. Please refer to FIG. 8A, which displays a cross sectional view illustrative of the gate stacks 802 and 804 having different sizes formed on a wafer 800 and an HDP-CVD deposition layer 806 is formed to cover the wafer 800. Because the sputter rate near corners is higher than elsewhere in the HDP-CVD process, a thicker spacer deposition layer will also be formed over the gate stack 804 even top of the deposition layer is flat. Next, please refer to FIG. 8B that shows a cross-section when a spacer deposition layer 808 is etched to form spacers. However, although the remained spacer deposition layer 808A cover the gate stack 804 except the flat portions of the HDP-CVD deposition layer 806, the gate stack 804 will not be destroyed because the HDP-CVD deposition layer 806 over the gate stack 804 is thick enough.

Elementary advantages offered by the disclosed method are described following. Firstly, because the widths of remained spacer deposition layers 208A are thinner than the conventional due to the elimination of the cap and spacer materials, a wider space between two gate stacks can be obtained. Therefore, the dielectric gap filling is easier to perform on the gate stacks fabricated by the invention. Secondly, due to the cap layer is formed without additional etch steps, the cost for fabricating the MOS devices according to the invention is significantly down because there is no need to employ separate etchant and anisotropically etch processes for forming the cap dielectric layer. Additionally, the disclosed method needs one step which anisotropically etching the spacer deposition layer 208 for fabricating the required spacers and cap dielectric layer, at least one process is saved than the conventional scheme.

As is understood by a person skilled in the art, the foregoing preferred embodiments of the present invention are illustrated of the present invention rather than limiting of the present invention. It is intended to cover various modifications and similar arrangements included within the spirit and scope of the appended claims, the scope of which should be accorded the broadest interpretation so as to encompass all such modifications and similar structure.

What is claimed is:

1. A method for forming a gate structure of a semiconductor device, said method comprising the steps of:

forming a gate oxide layer on a wafer;

forming a polysilicon layer on said gate oxide layer;

patterning said polysilicon layer to fabricate a gate stack;

depositing an first layer on said wafer, wherein a building of sharp ridges occurs over said gate stack;

conformally depositing a second layer; and anisotropically etching said second layer to form spacers against sidewall of said gate stack, wherein at least portions of said second layer remains on said sharp ridges.

2. The method according to claim 1, further comprising a method of forming a contact based on said gate structure comprising the steps of:

depositing a third layer on said wafer; and anisotropically etching said third layer to form a contact on said wafer.

3. The method according to claim 2, wherein portions of said first layer that placed between two of said gate stacks and non-covered by said second layer is etched when said third layer being anisotropically etched.

4. The method according to claim 2, wherein said second layer and said third layer have selectivity when performing said anisotropically etching.

5. The method according to claim 1, wherein said first layer is formed by an HDP-CVD (High-Density Plasma-Chemical Vapor Deposition) process.

6. The method according to claim 5, wherein said first layer is grown under a circumstance with a temperature from −10 to 100° C., an $O_2$ gas flow into a chamber from 3 to 300 sccm, a $SiH_4$ gas flow into said chamber from 3 to 300 sccm, and a pressure in said chamber from 10 to 100 milliTorr for depositing about 0.1 to 3 minutes.

7. The method according to claim 1, wherein said spacers are thicker than said portions of said second layer that remained on said sharp ridges of said gate stack.

8. The method according to claim 1, wherein said polysilicon layer comprising a metal layer on said polysilicon layer.

9. A method for forming a gate structure of a semiconductor device, said method comprising the steps of:

forming a gate oxide layer on a wafer;

forming a polysilicon layer on said gate oxide layer;

patterning said polysilicon layer to fabricate a gate stack;

depositing an HDP-CVD (High-Density Plasma-Chemical Vapor Deposition) deposition layer on said wafer, wherein said HDP-CVD deposition layer forms a building of sharp ridges over said gate stack;

conformally depositing a cap deposition layer; and anisotropically etching said cap deposition layer to form spacers against sidewall of said gate stack, wherein at least portions of said cap deposition layer remains on said sharp ridges.

10. The method according to claim 9, further comprising a method of forming a contact based on said gate structure comprising the steps of:

depositing an internal dielectric deposition layer on said wafer; and anisotropically etching said internal dielectric deposition layer to form a contact on said wafer placed between two of said gate stacks.

11. The method according to claim 10, wherein portions of said HDP-CVD deposition layer that placed between two of said gate stacks and non-covered by said cap deposition layer are etched when said internal dielectric deposition layer being anisotropically etched.

12. The method according to claim 10, wherein said cap deposition layer and said internal dielectric deposition layer have selectivity when performing said anisotropically etching.

13. The method according to claim 9, wherein said HDP-CVD deposition layer is grown under a circumstance with a temperature from −10 to 100° C., an $O_2$ and $SiH_4$ gas flow into a chamber from 3 to 300 sccm, a $SiH_4$ gas flow into said chamber from 3 to 300 sccm, and a pressure in said chamber from 10 to 100 milliTorr for depositing about 0.1 to 3 minutes.

14. The method according to claim 9, wherein said spacers are thicker than said portions of said cap deposition layer that remained on said sharp ridges of said gate stack.

15. The method according to claim 9, wherein said polysilicon layer comprises a metal layer on said polysilicon layer.

16. A method of forming a self-aligned contact structure for a semiconductor device, said method comprising the steps of:

forming a gate oxide layer on a wafer;

forming a polysilicon layer on said gate oxide layer;

forming a metal layer on said polysilicon layer;

patterning said polysilicon layer and said metal layer to fabricate a gate stack;

depositing an HDP-CVD (High Density Plasma-Chemical Vapor Deposition) deposition layer on said wafer, wherein said HDP-CVD deposition layer forms a building of sharp ridges over said gate stack;

conformally depositing a cap deposition layer;

anisotropically etching said cap deposition layer to form spacers against sidewall of said gate stack, wherein at least portions of said cap deposition layer remains on said sharp ridges;

depositing an internal dielectric deposition layer on said wafer; and anisotropically etching said internal dielectric deposition layer to form a contact on said wafer.

17. The method according to claim 16, wherein portions of said HDP-CVD deposition layer that placed between two of said gate stacks and non-covered by said second layer is etched when said internal dielectric deposition layer being anisotropically etched.

18. The method according to claim 16, wherein said cap deposition layer and said internal dielectric deposition layer have selectivity when performing said anisotropically etching.

19. The method according to claim 16, wherein said HDP-CVD deposition layer is grown under a circumstance with a temperature from −10 to 100° C., an $O_2$ and $SiH_4$ gas flow into a chamber from 3 to 300 sccm, a $SiH_4$ gas flow into said chamber from 3 to 300 sccm, and a pressure in said chamber from 10 to 100 milliTorr for depositing about 0.1 to 3 minutes.

20. The method according to claim 16, wherein said spacers are thicker than said portions of said cap deposition layer that remained on said sharp ridges of said gate stack.

* * * * *